(12) United States Patent
Kluth et al.

(10) Patent No.: US 6,486,062 B1
(45) Date of Patent: Nov. 26, 2002

(54) SELECTIVE DEPOSITION OF AMORPHOUS SILICON FOR FORMATION OF NICKEL SILICIDE WITH SMOOTH INTERFACE ON N-DOPED SUBSTRATE

(75) Inventors: George J. Kluth, Sunnyvale, CA (US); Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 13 days.

(21) Appl. No.: 09/636,510

(22) Filed: Aug. 10, 2000

(51) Int. Cl.[7] ................................................. H01L 21/44
(52) U.S. Cl. ...................... 438/682; 438/533; 438/591; 438/595; 438/660; 438/776; 438/786
(58) Field of Search ................................. 438/682, 660, 438/647, 533, 591, 595, 776, 786

(56) References Cited

U.S. PATENT DOCUMENTS 5,840,618 A * 11/1998 Kondo ........................ 438/533
6,331,468 B1 * 12/2001 Aronowitz ................... 438/287

* cited by examiner

*Primary Examiner*—David Nelms
*Assistant Examiner*—Reneé R Berry

(57) ABSTRACT

A nickel silicide layer is formed on a semiconductor device having a crystalline silicon source/drain region doped with arsenic. Arsenic is doped into the crystalline silicon, by implantation, for example, so that the concentration of arsenic is slightly below the surface of the silicon. Annealing restores the crystalline structure of the silicon after implantation of the arsenic. Amorphous silicon is selectively deposited over the source/drain regions and over the top of the gate electrode. Nickel is deposited over the entire semiconductor device and a second anneal reacts the nickel with the amorphous silicon. The second anneal is timed so that the nickel reacts with the amorphous silicon, and does not substantially react with the silicon source/drain regions containing arsenic. Preventing the nickel from substantially reacting with the silicon source/drain regions containing arsenic provides a smooth interface between the resulting nickel silicide and the silicon source/drain regions doped with arsenic.

12 Claims, 2 Drawing Sheets

SELECTIVE DEPOSITION OF AMORPHOUS SILICON FOR FORMATION OF NICKEL SILICIDE WITH SMOOTH INTERFACE ON N-DOPED SUBSTRATE

RELATED APPLICATIONS

This application contains subject matter similar to that disclosed in U.S. patent Ser. No. 09/639,776, filed on Aug. 16, 2000.

FIELD OF THE INVENTION

The present invention relates to semiconductor fabrication, and in particular to self-aligned silicide (salicide) technology utilizing nickel silicide (NiSi).

BACKGROUND ART

Salicide technology is improving the performance characteristics of semiconductor devices, and is becoming an essential component of semiconductor device fabrication. As gate electrode lengths are scaled down, the source/drain junctions and polycrystalline line width must also be scaled down. However, scaling down the source/drain junctions and polycrystalline line width increases parasitic resistance in the source/drain diffusion layers and gate electrode diffusion layer, and also increases the sheet and contact resistance of the gate electrode and source/drain regions. Salicide technology reduces parasitic, sheet, and contact resistance in the source/drain diffusion layers and gate electrode diffusion layer that results from scaling down the source/drain junctions and polycrystalline line width. Salicide technology comprises forming silicide layers on the source/drain regions and/or on the gate electrode in a self-aligned manner.

Silicides are typically formed by reacting a metal with crystallized silicon (Si) within a specified temperature range for a specific period of time. Silicide layers may be self-aligned by different techniques. For example, selectively depositing the metal on the top of the gate electrode and on the source/drain regions of a semiconductor device prior to an annealing process causes only the Si of the source/drain regions and the top of the gate electrode to form silicide upon annealing. Alternatively, sidewall spacers on the sides of the gate electrode constructed of a material that does not react with the metal layer allow a blanket layer of metal to be deposited over a semiconductor device while restricting silicide formation to the exposed source/drain regions and the top of the gate electrode during an annealing process. During the annealing process, the semiconductor device is heated to a reaction temperature, and held at the reaction temperature for a period of time, causing the metal layer to react with the crystallized Si that the metal contacts, thus forming a silicide layer interfacing with the remaining crystallized Si substrate of the source/drain regions and/or the gate electrode. Multiple annealing steps may be employed. Various metals react with Si to form a silicide, however, titanium (Ti) and cobalt (Co) are currently the most common metals used to create silicides when manufacturing semiconductor devices utilizing salicide technology.

Use of a $TiSi_2$ layer imposes limitations on the manufacture of semiconductor devices. A significant limitation is that the sheet resistance for lines narrower than 0.35 micrometers is high, i.e., as $TiSi_2$ is formed in a narrower and narrower line, the resistance increases. Another significant limitation is that $TiSi_2$ initially forms a high resistivity phase (C49), and transformation from C49 to a low resistivity phase (C54) is nucleation limited, i.e., a high temperature is required to affect the phase change.

Cobalt silicide, unlike $TiSi_2$, exhibits less linewidth dependence of sheet resistance. However, $CoSi_2$ consumes significant amounts of Si during formation, which increases the difficulty of forming shallow junctions. Large Si consumption is also a concern where the amount of Si present is limited, for example, with Si on insulator (SIO) substrates. Without enough Si to react with Co to form $CoSi_2$, a thin layer of $CoSi_2$ results. The thickness of the silicide layer is an important parameter because a thin silicide layer is more resistive than a thicker silicide layer of the same material, thus a thicker silicide layer increases semiconductor device speed, while a thin silicide layer reduces device speed.

Recently, attention has turned towards using nickel to form NiSi utilizing salicide technology. Using NiSi is advantageous over using $TiSi_2$ and $CoSi_2$ because many limitations associated with $TiSi_2$ and $CoSi_2$ are avoided. When forming NiSi, a low resistivity phase is the first phase to form, and does so at a relatively low temperature. Additionally, nickel (Ni), like Co, diffuses through the film into Si, unlike Ti where the Si diffuses into the metal layer. Diffusion of Ni, and Co, through the film into Si prevents bridging between the silicide layer on the gate electrode and the silicide layer over the sink/drain regions. The reaction that forms NiSi requires less Si than when $TiSi_2$ and $CoSi_2$ are formed. Nickel silicide exhibits almost no linewidth dependence of sheet resistance. Nickel silicide is normally annealed in a one step process, versus a process requiring an anneal, an etch, and a second anneal, as is normal for $TiSi_2$ and $CoSi_2$. Nickel silicide also exhibits low film stress, i.e., causes less wafer distortion.

Although the use of NiSi in salicide technology has certain advantages over utilizing $TiSi_2$ and $CoSi_2$, there are problems using NiSi in certain situations. Forming NiSi on doped, crystallized Si usually produces a smooth interface between the NiSi layer and the doped, crystallized Si layer. However, when crystallized Si is doped with arsenic (As), a rough interface between the NiSi and the doped, crystallized Si forms, which leads to certain problems.

Salicide technology employing NiSi has proven problematic because of interface roughness. A rough interface increases junction leakage, creates the possibility of spiking, and limits the thickness to which the silicide layer can be grown. Spiking occurs when the silicide layer interface is rough enough for spikes to form in the interface between the silicide layer and the crystallized Si comprising the source/drain region. For example, FIG. 1 depicts a prior art silicide layer 130 formed on semiconductor device 150. The interface 112 between the silicide 130 and the source/drain region 115 is rough and contains spikes 120. If a spike 120 is large enough to reach the bottom 125 of the source/drain region 115 increased junction leakage will occur.

FIGS. 2 and 3 depict a prior art method of forming a semiconductor device 150 with a NiSi layer 205 over an As doped source/drain 115. In FIG. 2, a Si substrate 102 has a gate dielectric layer 110 formed on it. A poly-silicon gate 100 is provided on a gate dielectric layer 110. Sidewalls 105 are formed on the sides of the poly-silicon gate 100 and are comprised of a material that does not react with Ni. The Si substrate 102 is doped with As, i.e., by implantation. Arsenic ions are implanted into the Si substrate 102, as well as into the poly-silicon gate 100 to form, source/drain regions 115. An annealing process recrystallizes the substrate 102, which is often amorphized during the As ion implantation. The annealing process also activates the As that has been implanted as a dopant. A layer of Ni 120 is then deposited over the semiconductor device 150. Heat is again applied to the semiconductor device during a second annealing process in order to react the layer of Ni 120 with the Si substrate 102 and with the poly-silicon gate 100. Un-reacted Ni is removed by a selective etching process, for example. FIG. 3 depicts the prior art semiconductor device 150 after the second annealing process, and the un-reacted metal has been removed. Because of the reaction between the As ions in the substrate 102 and the Ni atoms diffused from the Ni layer 120, a rough interface 200 is formed between the NiSi layer 205 and the As doped source/drain regions 115.

Several problems, as noted previously, are associated with a rough interface between the NiSi layer and the Si substrate. A rough interface increases junction leakage, and creates the possibility of spike formation. A rough interface also limits the thickness to which a silicide layer can be grown, thus limiting how low the resistivity of the silicide layer is.

There exists a need for salicide technology that enables a reduction in the parasitic sheet resistance without generating a high leakage current for As doped Si substrates. There exists a particular need for salicide technology permitting NiSi to interface with As doped Si without generating a high leakage current, and without limiting the thickness to which the NiSi is grown.

DISCLOSURE OF THE INVENTION

These and other needs are met by embodiments of the present invention, which provide a method of manufacturing a semiconductor device, the method comprising: forming a crystalline Si substrate; forming a gate electrode on the Si substrate having an upper surface and side surfaces; forming source/drain regions containing As in the crystallized Si substrate; heating the semiconductor device to recrystallize the Si substrate and the top of the gate electrode; selectively depositing a layer of amorphous Si on top of the gate electrode and on the exposed portions of the source/drain regions; depositing a Ni layer over the semiconductor device; and heating the semiconductor device to react the Ni layer with the layers of amorphous Si to form a NiSi layer on the exposed portions of the source/drain regions and on the top of the gate electrode.

Another aspect of the present invention relates to a semiconductor device. A semiconductor device comprises a crystalline, Si substrate having source/drain regions containing As. A gate dielectric layer on the Si substrate lies over the source/drain regions. A gate electrode is on the gate dielectric layer, and sidewall spacers are formed on the side surfaces of the gate electrode. A NiSi layer overlies each source/drain region, and a smooth substantially planar interface exists between the NiSi layer and each source/drain region containing As.

Another aspect of the present invention relates to a method of forming silicide, the method comprising: implanting As into a Si substrate to form active regions; and forming a NiSi on the Si substrate such that an interface between the formed NiSi and the active regions with implanted As is substantially a smooth interface.

One of the advantages of the present invention is the smooth interface formed between the NiSi and the underlying crystallized Si, in spite of the use of As as a dopant in the source/drain regions. This smooth interface reduces junction leakage and the risk of spike formation. A thicker silicide layer may therefore be grown using the methods of the present invention.

Additional advantages and other features of the present invention will be set forth in part in the description which follows, and in part will become apparent to those having ordinary skill in the art upon examination of the following, or may be learned by practice of the invention. The advantages of the present invention may be realized and attained as particularly pointed out in the appended claims.

DETAILED DESCRIPTION OF THE INVENTION

The present invention addresses and solves problems related to formation of a NiSi layer over a Si substrate doped with As. Emerging salicide technology employs NiSi in place of $TiSi_2$ and $CoSi_2$, but encounters interface roughness between NiSi and As-doped Si. When a sufficiently thick layer of NiSi is formed on the As-doped source/drain regions and a gate electrode utilizing current salicide technology to reduce parasitic resistances, a leakage current at the junction exists because of the rough interface. The present invention addresses and solves such problems by providing a relatively smooth interface between a NiSi layer and an As-doped Si substrate. A relatively smooth interface between NiSi and the underlying As-doped Si is achieved in the present invention by selectively depositing amorphous Si over the As-doped crystalline Si before a layer of Ni is deposited. The thickness of the amorphous Si layer that is deposited is approximately the same as the thickness of Si that is ordinarily consumed for a given thickness of deposited Ni when NiSi is formed. Therefore, the Ni layer reacts with the amorphous Si to form NiSi. Hence, the layer of amorphous Si containing no As is used to form NiSi, and the NiSi formation stops approximately where the amorphous Si contacts the crystalline Si doped with As. Such an arrangement of amorphous Si containing no As and crystallized Si containing As largely prevents the As from reacting with the Ni layer deposited over the amorphous Si when the reaction that forms NiSi occurs. Preventing As from reacting with Ni provides a relatively smooth interface between the NiSi and the Si doped with As.

Figure 1:
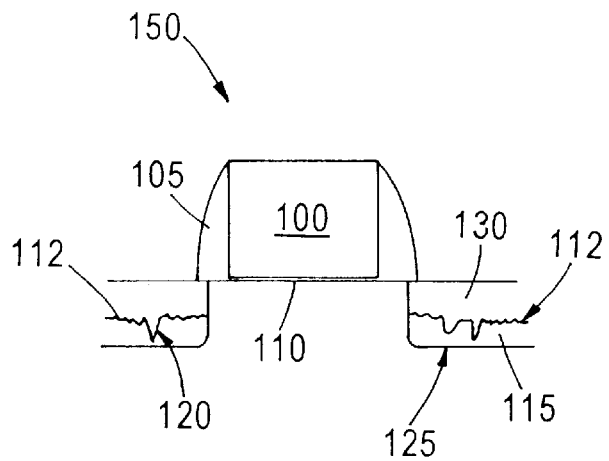
FIG. 1 depicts a prior art semiconductor device having a rough interface containing spikes between a silicide layer and silicon.
Figure 2:
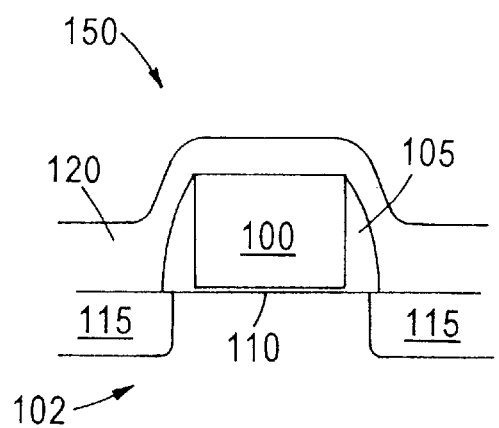
FIG. 2 depicts a prior art semiconductor device before formation of a nickel silicide layer that will interface with arsenic-doped silicon.
Figure 3:
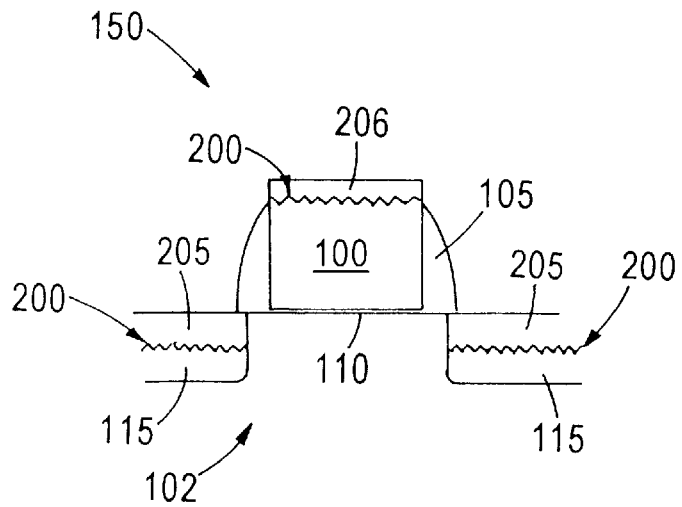
FIG. 3 depicts a prior art semiconductor device after formation of a nickel silicide layer interfacing with arsenic-doped silicon.
Figure 4:
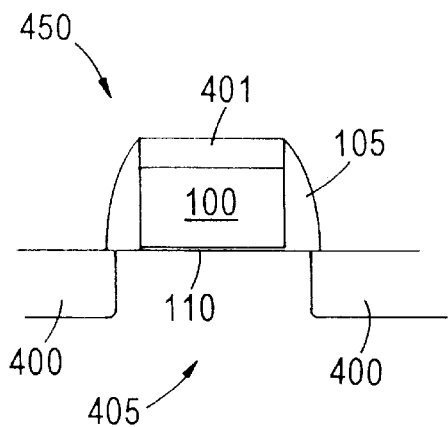
FIG. 4 depicts formation of source/drain regions according to an embodiment of the present invention.

Adverting to FIG. 4, a semiconductor device 450 comprises a crystalline Si substrate 405, a gate dielectric layer 110 on the surface of the crystalline Si substrate 405, and a gate electrode 100 on top of the gate dielectric layer 110, all manufactured by conventional methods. Sidewall spacers 105 formed on the sides of the gate electrode 100 are made from an oxide, nitride, or other standard material. The crystalline Si substrate 405, is then doped with As, by implantation, for example, so that the majority of the implanted As lies in regions 400. For example, As is implanted in a concentration ranging from approximately 1E15 ions/cm$^2$ to approximately 6E15 ions/cm$^2$ and at an energy ranging from approximately 5 keV to approximately 25 keV. These parameters are exemplary only, as other concentrations and implantation energies may be employed without departing from the invention. The As is thus implanted into the crystalline Si substrate 405 and the gate electrode 100 so that the greatest concentration of As in the regions 400 is slightly below the surface of the Si substrate 405, and the concentration of As in the region 401 on top of the gate electrode 100 is slightly below the surface. For example, the peak concentration of As occurs approximately 100 to approximately 250 Angstroms below the surface of the Si.

Implantation of As causes the Si of the gate electrode 100 and the crystalline Si substrate 405 to amorphize, i.e., lose their crystalline structure. An annealing process restores the crystalline structure of the gate electrode 100 and of the Si substrate 405. For example, the annealing process may be a rapid thermal anneal (RTA) occurring at a temperature above 1000° C. for approximately 5 to approximately 30 seconds.

Figure 5:
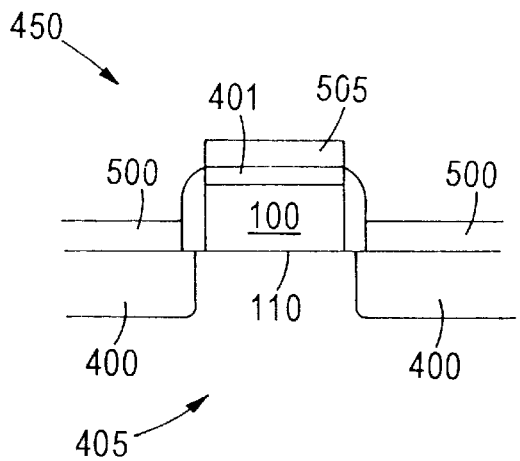
FIG. 5 depicts selective deposition of amorphous silicon on the gate electrode and exposed portions of the source/drain regions according to the embodiment of the present invention depicted in FIG. 4.

Adverting to FIG. 5, after As has been implanted into the crystalline Si substrate 405 and the gate electrode 100, and the first annealing process is complete, layers of amorphous Si 500 and 505 are selectively deposited over the semiconductor device 450. Selective deposition of amorphous Si is performed utilizing any well-known method. Amorphized Si 505 is deposited on top of the gate electrode 100, and amorphized Si 500 is deposited on the exposed portions of the source/drain regions 400. For example, amorphous Si layers 500 and 505 are deposited to a thickness in the range of approximately 250 Angstroms to approximately 600 Angstroms. The deposited amorphous Si layers 500 and 505 do not contain As.

Figure 6:
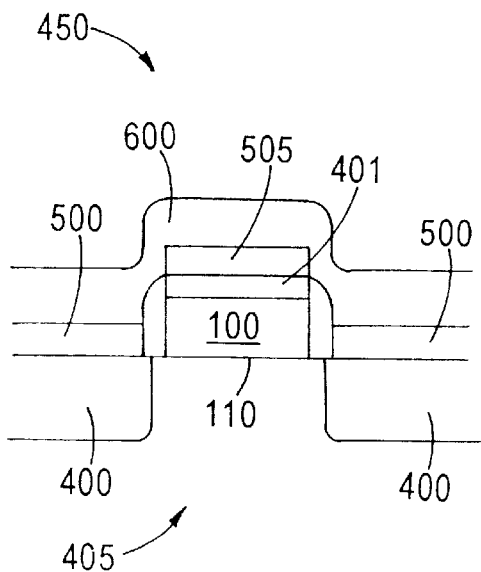
FIG. 6 depicts formation of a nickel silicide layer according to the embodiment of the present invention depicted in FIG. 5.

Adverting to FIG. 6, a layer of Ni 600 is deposited over the semiconductor device 450. For example, the Ni layer 600 is deposited by sputtering, or other conventional technique, onto semiconductor device 450 to a thickness having a ratio of approximately 100 Angstroms of Ni for approximately 180 Angstroms of amorphous Si 500 and 505 deposited onto semiconductor device 450.

A second annealing process reacts the Ni layer 600 with the amorphous Si layers 505 and 500 deposited on the top of the gate electrode 100 and over the As-doped source/drain regions 400, respectively. The second annealing process occurs under temperature and time conditions that allow the Ni layer 600 to react with the amorphous Si layers 500 and 505. For example, the second anneal is a RTA occurring at a temperature in the range of approximately 400° C. to approximately 650° C. for a duration of approximately 15 to approximately 60 seconds.

The thickness of the Ni layer 600 is primarily responsible for controlling the depth of the resulting NiSi layer. Therefore, the Ni layer 600 has a thickness, as described supra, that allows the Ni layer 600 to react with the amorphous Si layers 500 and 505, without substantially reacting with the As-doped Si layers 400 or the As-doped Si on top of the gate electrode 100 in region 401.

Figure 7:
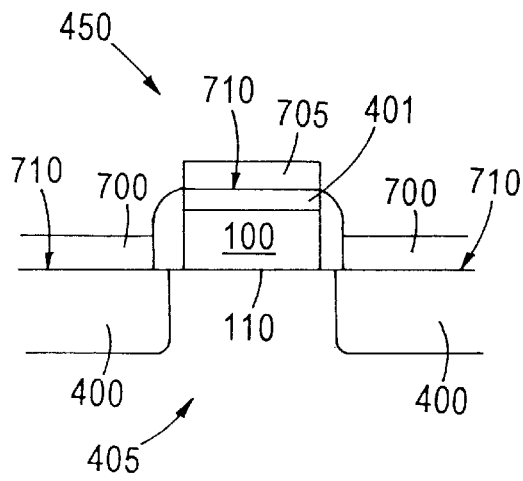
FIG. 7 depicts a semiconductor device having a relatively smooth interface between a nickel silicide layer and respective underlying, crystalline silicon doped with arsenic according to the embodiment of the present invention depicted in FIG. 6.

In FIG. 7, a smooth interface 710 exists between the NiSi layers 700, 705 and the As-doped source/drain region 400 and the As-doped region 401 of the gate electrode 100, respectively. Advantages attained by the inventive method result from limited or no interaction between the implanted As in Si regions 400 and the top region 401 of the gate electrode 100, and the Ni layer 600. During NiSi formation, the Ni layer 600 reacts primarily with the amorphous Si layers 500 and 505, thereby interacting with undoped Si, and the Ni-Si reaction stops before reaching the As-doped Si layers 400 and the As-doped Si layer 401 on top of the gate electrode 100. The resulting interface between the NiSi and As-doped Si layers 400 is a smooth interface 710 with low junction leakage. The smooth interface 710 allows growth of sufficiently thick layers of NiSi 700 and 705 so that the resistivity of the NiSi layers 700 and 705 is low. Additionally, the smooth interface 710 eliminates spikes that can increase junction leakage.

In the previous description, numerous specific details are set forth, such as specific material, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing semiconductor devices, the method comprising the steps of:

forming a crystallized silicon substrate;

forming a gate electrode on the silicon substrate, having an upper surface and side surfaces;

forming source/drain regions containing arsenic in the crystallized silicon substrate;

heating the semiconductor device to recrystallize the silicon substrate and the top of the gate electrode;

selectively depositing layers of amorphous silicon over the gate electrode and each source/drain region;

depositing a nickel layer over the semiconductor device; and heating the semiconductor device to react the nickel layer and the selectively deposited layers of amorphous silicon to form nickel silicide.

2. The method of claim 1, wherein forming source/drain regions containing arsenic in the crystallized silicon substrate comprises:

implanting arsenic into the crystallized silicon substrate.

3. The method of claim 2, wherein:

arsenic is implanted into the top of the gate electrode; and wherein the heating of the semiconductor device is such as to recrystallize the top of the gate electrode.

4. The method of claim 1, wherein:

arsenic is implanted to a depth of approximately 100 to approximately 250 Angstroms in the crystallized silicon substrate.

5. The method of claim 1, wherein:

the selectively deposited layers of amorphous silicon over the gate electrode and each source/drain region are approximately 250 to approximately 600 Angstroms thick.

6. The method of claim 1, wherein:

heating the semiconductor device to recrystallize the silicon substrate occurs at a temperature greater than 1000 degrees Celsius for approximately 5 to approximately 30 seconds.

7. The method of claim 1, wherein:

the nickel layer deposited over the semiconductor device is in a ratio of approximately 100 Angstroms of nickel for approximately 180 Angstroms of amorphous silicon.

8. The method of claim 1, wherein:

heating the semiconductor device a second time to react the nickel layer and the selectively deposited layers of amorphous silicon occurs at a temperature between approximately 400 to approximately 650 degrees Celsius for approximately 15 to approximately 60 seconds.

9. A method of forming silicide, comprising the steps of:

implanting arsenic into a silicon substrate to form active regions; and forming a nickel silicide on the silicon substrate such that an interface between the formed nickel silicide and the active regions with implanted arsenic is substantially a smooth interface.

10. The method of claim 9, wherein:

the step of forming a nickel silicide includes selectively depositing amorphous silicon on the silicon substrate.

11. The method of claim 10, wherein:

the step of forming a nickel silicide includes depositing nickel on the amorphous silicon, wherein the ratio of nickel to amorphous silicon is approximately 100 Angstroms of nickel for approximately 180 Angstroms of amorphous silicon.

12. The method of claim 11, wherein:

the step of forming a nickel silicide includes heating the semiconductor to react the nickel layer and the selectively deposited amorphous silicon at a temperature between approximately 400 to approximately 650 degrees Celsius for approximately 15 to approximately 60 seconds.

\* \* \* \* \*

UNITED STATES PATENT AND TRADEMARK OFFICE
CERTIFICATE OF CORRECTION

PATENT NO. : 6,486,062 B1  Page 1 of 1
DATED : November 26, 2002
INVENTOR(S) : Kluth et al.

It is certified that error appears in the above-identified patent and that said Letters Patent is hereby corrected as shown below:

<u>Title page,</u>
Item [*] Notice, should read -- Subject to any disclaimer, the term of this patent is extended or adjusted under 35 U.S.C. 154(b) by 0 days. --.

Signed and Sealed this

Twenty-first Day of September, 2004

JON W. DUDAS
*Director of the United States Patent and Trademark Office*